(12) United States Patent
Ochs et al.

(10) Patent No.: US 11,398,423 B2
(45) Date of Patent: Jul. 26, 2022

(54) SEMICONDUCTOR ASSEMBLY AND METHOD OF PRODUCING THE SEMICONDUCTOR ASSEMBLY

(71) Applicant: Siemens Aktiengesellschaft, Munich (DE)

(72) Inventors: Ewgenij Ochs, Fürth (DE); Stefan Pfefferlein, Heroldsberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 17/042,669

(22) PCT Filed: Mar. 26, 2019

(86) PCT No.: PCT/EP2019/057570
§ 371 (c)(1),
(2) Date: Sep. 28, 2020

(87) PCT Pub. No.: WO2019/185620
PCT Pub. Date: Oct. 3, 2019

(65) Prior Publication Data
US 2021/0050290 A1 Feb. 18, 2021

(30) Foreign Application Priority Data
Mar. 29, 2018 (EP) .................................. 18165112

(51) Int. Cl.
*H01L 23/498* (2006.01)
*H01L 23/367* (2006.01)

(52) U.S. Cl.
CPC .... *H01L 23/49833* (2013.01); *H01L 23/3672* (2013.01)

(58) Field of Classification Search
CPC ........... H01L 23/49833; H01L 23/3672; H01L 23/498; H01L 23/367; H01L 2224/73253
(Continued)

(56) References Cited

U.S. PATENT DOCUMENTS 4,788,767 A * 12/1988 Desai ..................... H05K 3/363
257/E21.705
7,829,386 B2 * 11/2010 Fillion ................. H01L 25/072
438/119
(Continued)

FOREIGN PATENT DOCUMENTS

CN 1933106 A 3/2007
CN 104867903 A 8/2015
EP 2312916 A2 4/2011

OTHER PUBLICATIONS

PCT International Search Report and Written Opinion of International Search Authority dated Jun. 18, 2019 corresponding to PCT International Application No. PCT/EP2019/057570 filed Mar. 26, 2019.

*Primary Examiner* — Alexander O Williams
(74) *Attorney, Agent, or Firm* — Henry M. Feiereisen LLC (57) ABSTRACT

A semiconductor assembly includes a carrier element with a first carrier element conductor path, a semiconductor chip, an electrically insulating element having a first insulating element conductor path, and a first spacer element. The semiconductor chip is connected electrically and mechanically on a first semiconductor side via a first connecting material to the first carrier element conductor path. The semiconductor chip is connected on a second semiconductor side, which faces away from the first semiconductor side of the semiconductor chip, via a second connecting material to the first insulating element conductor path, which is arranged on a first insulating element side of the electrically insulating element. The first spacer element is arranged for maintaining a distance between the carrier element and an assembly element facing toward the second semiconductor side of the semiconductor chip and is connected mechanically to both the carrier element and the assembly element.

8 Claims, 5 Drawing Sheets

(58) Field of Classification Search
USPC ............................................................ 257/666
See application file for complete search history.

(56) References Cited

U.S. PATENT DOCUMENTS

| | | | |
|---|---|---|---|
| 8,981,553 B2* | 3/2015 | Schwarzer | H01L 23/36 257/701 |
| 9,034,695 B2* | 5/2015 | Hsieh | H01L 21/4878 438/113 |
| 2005/0046001 A1* | 3/2005 | Warner | H01L 23/645 257/678 |
| 2005/0133932 A1* | 6/2005 | Pohl | H01L 23/49833 438/109 |
| 2006/0163587 A1* | 7/2006 | Erchak | H01L 25/0753 257/82 |
| 2006/0163590 A1* | 7/2006 | Erchak | F21K 9/00 257/88 |
| 2007/0111397 A1 | 5/2007 | Kim et al. | |
| 2007/0246823 A1* | 10/2007 | Haga | H01L 23/24 257/712 |
| 2008/0305582 A1* | 12/2008 | Fillion | H01L 25/072 438/118 |
| 2009/0039495 A1* | 2/2009 | Yamashita | H01L 24/28 257/784 |
| 2009/0091904 A1* | 4/2009 | Hatanaka | H03H 9/1021 361/764 |
| 2010/0299918 A1* | 12/2010 | Oda | H01L 24/29 29/841 |
| 2011/0001232 A1* | 1/2011 | Weissbach | H01L 24/10 257/737 |
| 2011/0080714 A1 | 4/2011 | Tsukada et al. | |
| 2011/0149537 A1* | 6/2011 | Kurosawa | H01L 23/42 361/760 |
| 2012/0320548 A1* | 12/2012 | Lu | H05K 1/141 361/760 |
| 2013/0075932 A1* | 3/2013 | Schwarzer | H01L 23/49827 257/774 |
| 2013/0273694 A1 | 10/2013 | Hsieh et al. | |
| 2014/0061893 A1* | 3/2014 | Saeidi | H01L 21/52 257/712 |
| 2015/0155267 A1* | 6/2015 | Hoegerl | H01L 24/03 257/698 |
| 2015/0241631 A1* | 8/2015 | Fish | G02B 6/136 385/14 |
| 2015/0243609 A1* | 8/2015 | Lamorey | H01L 25/165 361/717 |
| 2016/0056057 A1* | 2/2016 | Yu | H01L 23/5389 257/774 |
| 2016/0307788 A1* | 10/2016 | Hu | H01L 21/2885 |
| 2017/0133351 A1* | 5/2017 | Su | H01L 25/50 |
| 2017/0263518 A1* | 9/2017 | Yu | H01L 25/00 |
| 2017/0301606 A1 | 10/2017 | Ko | |
| 2018/0061787 A1* | 3/2018 | Wu | H01L 23/13 |
| 2018/0182700 A1* | 6/2018 | Sato | H01L 21/565 |
| 2019/0051608 A1* | 2/2019 | Sugiyama | H01L 23/13 |
| 2019/0103362 A1* | 4/2019 | Lin | H01L 24/19 |
| 2019/0189564 A1* | 6/2019 | Guzek | H01L 21/568 |
| 2019/0371781 A1* | 12/2019 | Huang | H01L 21/486 |
| 2020/0075562 A1* | 3/2020 | Yu | H01L 21/6835 |
| 2020/0105642 A1* | 4/2020 | Gandhi | H01L 23/427 |
| 2020/0105689 A1* | 4/2020 | Hwang | H01L 24/25 |
| 2020/0219815 A1* | 7/2020 | Elsherbini | H01L 25/18 |
| 2020/0227377 A1* | 7/2020 | Liff | H01L 24/16 |
| 2020/0227401 A1* | 7/2020 | Elsherbini | H01L 23/5384 |
| 2020/0235082 A1* | 7/2020 | Eid | H01L 21/4882 |
| 2020/0273840 A1* | 8/2020 | Elsherbini | H01L 23/49822 |
| 2020/0388591 A1* | 12/2020 | Wang | H01L 25/0652 |
| 2021/0020560 A1* | 1/2021 | Wang | H01L 21/486 |
| 2021/0057384 A1* | 2/2021 | Kao | H01L 23/367 |

* cited by examiner

FIG. 8

SEMICONDUCTOR ASSEMBLY AND METHOD OF PRODUCING THE SEMICONDUCTOR ASSEMBLY

CROSS-REFERENCES TO RELATED APPLICATIONS

This application is the U.S. National Stage of International Application No. PCT/EP2019/057570, filed Mar. 26, 2019, which designated the United States and has been published as International Publication No. WO 2019/185620 A1 and which claims the priority of European Patent Application, Serial No. 18165112.6, filed Mar. 29, 2018, pursuant to 35 U.S.C. 119(a)-(d).

BACKGROUND OF THE INVENTION

The invention relates to a semiconductor assembly having a carrier element with a first carrier element conductor path, a semiconductor, and an electrically insulating element with a first insulating element conductor path. The invention further relates to a method for producing the semiconductor assembly and to a semiconductor assembly system with at least two of the semiconductor assemblies.

Semiconductors of semiconductor assemblies, such as are used for example in the industrial environment as power semiconductors or semiconductor modules in assemblies of electrical drive or automation devices, are connected both mechanically and also electrically to the internal peripherals of said devices by means of carrier elements, usually in the form of printed circuit boards, via the carrier element conductor paths arranged thereon. Here, the semiconductors usually have mechanical and electrical connections to the carrier element on not just one of their sides.

In particular in power semiconductor modules of this kind, the connections of these semiconductors are often contacted via two sides of the semiconductor which face away from one another, wherein some of the connections on one of the sides of the semiconductor are often also contacted electrically and mechanically via the insulating element conductor paths arranged on an electrically insulating element, which is usually embodied as a ceramic substrate.

Furthermore, the electrically insulating element is generally also connected to a heat sink, which during operation of the semiconductors absorbs their heat losses and dissipates them into the wider surroundings.

In the production of electrical and mechanical connections of this kind, SMD soldering methods are often applied in order to achieve material-bonded connections, wherein the heating and the subsequent cooling process of the connecting material, in this case for example the soldering material, has the consequence that for example the electrically insulating element and the semiconductor are not aligned parallel to the carrier element over the opposing surfaces of the electrically insulating element and the carrier element as intended, but instead are tilted or even distorted in their own structure.

This happens inter glia because, during the melting of the solder material, the outgassing of its binding agent and flux causes the solder material at the solder deposit to undergo a volume shrinkage, the extent of which can be estimated only insufficiently for high quality requirements. Furthermore, an attraction effect of the components to be connected mechanically and electrically results from a wetting force formed on the solder material and from the cooling and shrinkage of the solder material.

One possibility for maintaining the components to be connected mechanically and electrically, such as the semiconductor, the carrier element and the electrically insulating element, in their parallel alignment opposite one another and prevent them from tilting, even after the thermal connection process, here for example after the SMD soldering process, can be offered for example by corresponding fixing tools or also fixing adhesives for fixing the component to be soldered, for example.

These known solutions do however place very high demands on the production process for semiconductor assemblies in terms of achieving the required quality with the means indicated, which can be achieved only with great difficulty given the increasingly restricted cost structures of the manufacturers.

There is also the danger that, during an operational, in particular excessive heating of the semiconductor assembly, the connections formed by means of the soldering process at the solder deposit will be subjected to a renewed thermal loading so that the described tilting can now occur for the first time in the absence of an adequate fixing of said components.

SUMMARY OF THE INVENTIONS

The object underlying the invention is therefore to propose a semiconductor assembly and a method for producing the semiconductor assembly which prevent a tilting of components of the semiconductor assembly within the semiconductor assembly after a thermal treatment of connecting materials to produce mechanical connections, which also provide electrical connections, or to improve the same compared to the prior art.

The object is achieved by a semiconductor assembly having the features as set forth hereinafter. The object is further achieved by a method for producing the semiconductor assembly as set forth hereinafter and by a semiconductor assembly system as set forth hereinafter.

Advantageous embodiments of the semiconductor assembly are specified in the dependent claims.

The invention is based inter alia on the knowledge that, compared to the prior art, fixing or spacer elements are required which can be incorporated with little outlay into the production process for semiconductor assemblies, cannot be influenced by thermal treatments for producing mechanical and mechanical/electrical connections, and during operation permanently prevent the described tilting of components when the semiconductor assembly is heated, in some cases just for a short time, in excess of a value for the heating of the semiconductor assembly during continuous operation (e.g. brief period of peak load).

To achieve the object, a semiconductor assembly is proposed which comprises a carrier element with a first carrier element conductor path, a semiconductor, an electrically insulating element having a first insulating element conductor path, a first spacer element and at least one further spacer element, wherein the semiconductor is connected electrically and mechanically on a first semiconductor side by means of a first connecting material to the first carrier element conductor path, wherein the semiconductor is connected electrically and mechanically on a second semiconductor side facing away from the first semiconductor side of the semiconductor by means of a second connecting material to the first insulating element conductor path, which is arranged on a first insulating element side of the electrically insulating element, wherein the first spacer element is arranged for maintaining a distance between the carrier element and an assembly element facing toward the second semiconductor side of the semiconductor and is connected mechanically to the carrier element and the assembly element respectively, wherein the further spacer element is also arranged for maintaining the distance between the carrier element and the assembly element facing toward the second semiconductor side of the semiconductor and is connected mechanically to the carrier element and the assembly element, wherein the first spacer element and at least the one further spacer element is embodied as a common spacer element and wherein the common spacer element consists of at least two segments and forms a closed or at least almost closed frame.

The first spacer element advantageously prevents a tilting of the assembly element and for example of further components attached mechanically thereto with respect to the carrier element by the first spacer element defining the distance between assembly element and carrier element and fixing the assembly element at least in relation to the carrier element and maintaining it at a distance therefrom, irrespective of thermal stresses during the production and operation of the semiconductor assembly which can in some cases extend beyond the thermal treatment of the connecting materials for producing electrical and mechanical connections.

The semiconductor assembly according to the invention further supports a contacting of the semiconductor from two sides of the semiconductor facing away from one other, on the one hand via the first carrier element conductor path of the carrier element and on the other hand via the first insulating element conductor path of the electrically insulating element. Here, the electrically insulating element can be provided at least in part also as a heat dissipation component (as a heat sink) for an operational heat dissipation of the semiconductor.

The frame formed by the common spacer element can for example advantageously surround the semiconductor.

An almost closed frame has at least one opening in the frame, by means of which for example an electrical connection can be guided from outside the frame into the interior space surrounded by the frame or a casting compound can be introduced into the interior space surrounded by the frame.

It is also conceivable, however, for the first spacer element in itself to form a closed or an at least almost closed frame.

In an alternative embodiment falling outside the scope of this invention, a semiconductor assembly comprises a carrier element with a first carrier element conductor path, a semiconductor, an electrically insulating element having a first insulating element conductor path, and a first spacer element, wherein the semiconductor is connected electrically and mechanically on a first semiconductor side by means of a first connecting material to the first carrier element conductor path, wherein the semiconductor is connected electrically and mechanically on a second conductor side, which faces away from the first semiconductor side, by means of a second connecting material to the first insulating element conductor path, which is arranged on a first insulating element side of the electrically insulating element, wherein the first spacer element is arranged for maintaining a distance between the carrier element and an assembly element facing toward the second semiconductor side of the semiconductor and is connected mechanically to the carrier element and the assembly element respectively.

In a first advantageous embodiment of the semiconductor assembly, the semiconductor assembly comprises at least one further spacer element, wherein the further spacer element is arranged for maintaining the distance between the carrier element and the assembly element which faces toward the second semiconductor side of the semiconductor and is connected mechanically to the carrier element and the assembly element.

Here, a further spacer element advantageously improves the stability of the fixing and the maintenance of the distance between the carrier element and the assembly element and thus increases the resistance to tilting for example by means of a geometric arrangement of the corresponding spacer elements as required, wherein the requirement is then derived for example from the geometric superstructure of the semiconductor assembly.

In a further advantageous embodiment of the semiconductor assembly, the first spacer element and, if present, the further spacer element are at least electrically currentless or electrically volt-free and electrically currentless when the semiconductor assembly is operational.

The advantage of this embodiment consists for example in that the spacer elements do not have to be made only from electrically conductive materials. Accordingly, mechanically stable and essentially non-conductive materials, such as plastics and ceramics, can also be used to embody the spacer elements.

In a further advantageous embodiment of the semiconductor assembly, the first spacer element and, if present, the further spacer element are each embodied in one piece or in several pieces, in particular in a layered manner.

As a result of the embodiment of the spacer elements in several pieces, in particular in several layers, a fine-grained, requirement-based setting for maintaining the distance between the carrier element and the assembly element is produced by means of the spacer elements.

In a further advantageous embodiment of the semiconductor assembly, the assembly element is the electrically insulating element or the assembly element is a heat conducting element which is arranged on a second insulating element side of the electrically insulating element facing away from the first insulating element side and is connected mechanically to the electrically insulating element, or the assembly element is a heat sink which is arranged on a second insulating element side of the electrically insulating element facing away from the first insulating element side and is connected mechanically to the electrically insulating element, either directly or by way of a heat conducting element.

Depending on the superstructure of the semiconductor assembly and the space available thereon, the first spacer element and, if present, the further spacer element can advantageously be arranged between the carrier element and various elements referred to here as assembly element, the electrically insulating element, the heat conducting element and the heat sink, for maintaining the distance and for fixing purposes. This enables a flexible configuration of the semiconductor assembly in line with customer requirements and technical further development.

The heat conducting element (e.g. embodied as a heat conducting pad or heat conducting compound) is often introduced directly between the electrically insulating element (e.g. a ceramic substrate on which the semiconductor is contacted) and the heat sink (usually the main heat dissipation element of the semiconductor assembly) in order to improve the heat dissipation of the semiconductor.

In a further advantageous embodiment of the semiconductor assembly, if the assembly element is the electrically insulating element, the first spacer element and, if present, the further spacer element each have a first height, the height value of which can assume as a maximum the distance value of a first distance between the electrically insulating element and the carrier element in the direct region of the mechanical connection of the respective spacer element to the electrically insulating element and the carrier element.

With this advantageous embodiment, the first height of the spacer elements is limited in such a way that on the one hand the necessary first distance between carrier element and electrically insulating element is maintained in order to fix the carrier element and the electrically insulating element adequately with respect to one another, and on the other hand it is ensured that the space (e.g. for solder deposit) for the connecting material (e.g. the solder) for producing mechanical and electrical connections, depending on the thermal treatment method (e.g. by means of soldering), is neither too small nor too great for a high-quality connection (e.g. a low-resistance and low-inductance electrical connection).

In a further advantageous embodiment of the semiconductor assembly, if the assembly element is the heat conducting element, the spacer element and, if present, the further spacer element each have a second height, the height value of which can assume as a maximum the distance value of a second distance between the heat conducting element and the carrier element in the direct region of the mechanical connection of the respective spacer element to the heat conducting element and the carrier element.

With this advantageous embodiment, the second height of the spacer elements is limited in such a way that on the one hand the necessary second distance between carrier element and heat conducting element is maintained in order to fix the carrier element and the heat conducting element adequately with respect to one another, and on the other hand it is ensured that the space (e.g. the solder deposit) for the connecting material (e.g. the solder) for producing mechanical and electrical connections, depending on the thermal treatment method (e.g. by means of soldering), is neither too small nor too great for a high-quality connection (e.g. a low-resistance and low-inductance electrical connection).

In a further advantageous embodiment of the semiconductor assembly, if the assembly element is the heat sink, the spacer element and, if present, the further spacer element each have a third height, the height value of which can assume as a maximum the distance value of a third distance between the heat sink and the carrier element in the direct region of the mechanical connection of the respective spacer element to the heat sink and the carrier element.

With this advantageous embodiment, the first height of the spacer elements is limited in such a way that on the one hand the necessary first distance between carrier element and heat sink is maintained in order to fix the carrier element and the heat sink adequately with respect to one another, and on the other hand it is ensured that the space (e.g. the solder deposit) for the connecting material (e.g. the solder) for producing mechanical and electrical connections, depending on the thermal treatment method (e.g. by means of soldering), is neither too small nor too great for a high-quality connection (e.g. a low-resistance and low-inductance electrical connection).

In a further advantageous embodiment of the semiconductor assembly, protrusions are provided on one or on both opposing sides of the carrier element and the assembly element, which protrusions reduce the respectively first distance or the respectively second distance or the respectively third distance at the point between the carrier element and the assembly element at which the first spacer element and, if present, the further spacer element are arranged.

These protrusions of the assembly element and/or of the carrier element can advantageously be embodied as a monolithic unit with the assembly element and/or the carrier element or can for example be connected mechanically in a form-fit or force-fit manner to the assembly element and/or the carrier element. It is however also possible for these protrusions to embody spacers in part or in whole.

In a further advantageous embodiment of the semiconductor assembly, the first insulating element conductor path is connected electrically and mechanically to a second carrier element conductor path by means of a fourth connecting material.

This mechanical connection is advantageously used to produce a first electrical contacting of contacts which are arranged on the second semiconductor side of the semiconductor and electrical components which are arranged on the carrier element or can be reached via the carrier element, wherein the carrier element faces away from the second semiconductor side of the semiconductor.

In a further advantageous embodiment of the semiconductor assembly, the semiconductor is connected electrically and mechanically on the second semiconductor side by means of a third connecting material to a second insulating element conductor path which is arranged on the first insulating element side of the electrically insulating element, and the second insulating element conductor path is connected electrically and mechanically by means of a fifth connecting material to a third carrier element conductor path.

This mechanical connection is advantageously used to produce a further electrical contacting of contacts which are arranged on the second semiconductor side of the semiconductor and electrical components which are arranged on the carrier element or can be reached via the carrier element, wherein the carrier element faces away from the second semiconductor side of the semiconductor.

In a further advantageous embodiment of the semiconductor assembly, the melting point of the first spacer element and, if present, the melting point of the further spacer element are higher than the respective melting point of the connecting materials, if present.

This advantageous embodiment prevents the spacer elements from being damaged in their structure or even destroyed during a thermal treatment (e.g. soldering) of the connecting materials (e.g. soldering material such as soldering tin) such that they are no longer suitable for maintaining the distance and for fixing carrier element and assembly element. Materials for spacers which fulfill a requirement of this kind can consist for example of metal, ceramic or also of particularly heats resistant plastic.

To achieve the object, a method for producing a semiconductor assembly according to the invention is also proposed, which method has the following steps.

In a first step, a first spacer element and, if present, a further spacer element is applied in a form-fit or force-fit or material-bonded manner to a carrier element and/or an assembly element of the semiconductor assembly.

In a second step, a first connecting material is applied to a first semiconductor side of a semiconductor and/or to a first carrier element conductor path of a carrier element of the semiconductor assembly.

In a third step, a fourth connecting material is applied to a first insulating element conductor path of an electrically insulating element and/or to a second carrier element conductor path of the carrier element of the semiconductor assembly.

In a fourth step, a fifth connecting material is applied to a second insulating element conductor path of the electrically insulating element and/or to a third carrier element conductor path of the carrier element, if provision is made for a further electrical and mechanical connection between the second insulating element conductor path and the third carrier element conductor path of the semiconductor assembly.

In a fifth step, the carrier element and the assembly element are applied to the first spacer element and, if present, to the further spacer element.

In a sixth step, the first connecting material, the fourth connecting material and, if provided, the fifth connecting material undergo a thermal treatment in order to produce material-bonded electrical and mechanical connections to the carrier element conductor paths, the insulating element conductor paths and the semiconductor.

In this context, a thermal treatment can be for example a soldering process, which thermally treats the connecting material (the solder) in such a way that a mechanical and electrical connection is produced between assembly element and carrier element (e.g. by way of their conductor paths). Furthermore, connecting materials can also be thermally treated by means of sintering processes in order to produce such a mechanical and electrical connection.

To achieve the object, a semiconductor assembly system with at least two semiconductor assemblies according to the invention is also proposed, wherein the heat sinks of the respective semiconductor assemblies embody a common heat sink.

Here, the common heat sink thus embodied is particularly advantageously suited to improving the modular configuration of the semiconductor assembly system as well as the mechanical stability and the heat dissipation of the semiconductor assemblies in the semiconductor assembly system.

BRIEF DESCRIPTION OF THE DRAWING

The above-described characteristics, features and advantages of this invention, as well as the manner in which these are achieved, will become clearer and more readily understandable in connection with the following description of the exemplary embodiments, which are explained in more detail in conjunction with the figures, in which.

DETAILED DESCRIPTION OF PREFERRED EMBODIMENTS

Figure 1:
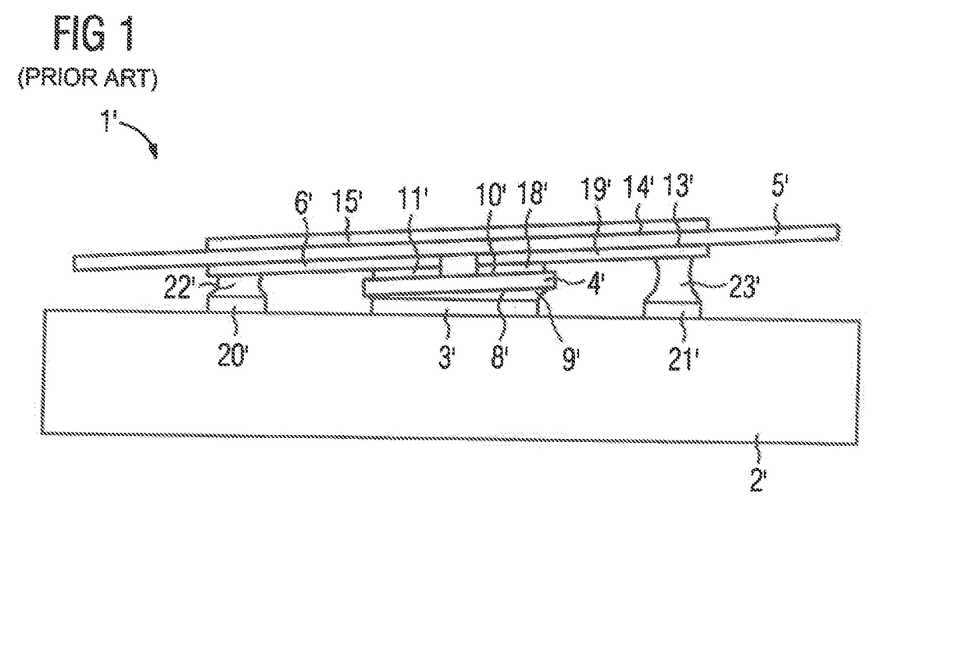
FIG. 1 shows a schematic representation of a semiconductor assembly according to the prior art.

FIG. 1 shows a schematic representation of a semiconductor assembly 1' according to the prior art.

A semiconductor chip 4' with its first semiconductor side 8', which faces toward the carrier element 2', is connected electrically and mechanically to a first carrier element conductor path 3' of a carrier element 2' by means of a first connecting material 9'.

The semiconductor chip 4' with its second semiconductor side 10' is furthermore connected mechanically and electrically on the one hand by means of a second connecting material 11' to a first insulating element conductor path 6' of an electrically insulating element 5' and on the other hand by means of a third connecting material 18' to a second insulating element conductor path 19' of the electrically insulating element 5' to the electrically insulating element 5' on its first insulating element side 13'.

Furthermore, the first insulating element conductor path 6' is connected electrically and mechanically by means of a fourth connecting material 22' to a second carrier element conductor path 20' of the carrier element 2' and the second insulating element conductor path 19' is connected electrically and mechanically by means of a fifth connecting material 23' to a third carrier element conductor path 21' of the carrier element 2'.

A heat conducting element 15' is arranged on the second insulating element side 14' of the electrically insulating element 5'. This heat conducting element 15' is generally used if the heat dissipation of the semiconductor chip 4' via the electrically insulating element 5' Is to be improved and a corresponding thermal transition, e.g. to a heat sink (not shown in FIG. 1) is to be supported. If a heat sink of this kind is connected to the second insulating element side 14' of the electrically insulating element 5', it is also possible to correct material unevennesses of this mechanical/thermal connection by introducing the heat conducting element 15' directly into this mechanical/thermal connection.

The schematic representation in FIG. 1 clearly shows a tilting of the electrically insulating element 5' relative to the carrier element 2', such as can occur after a soldering process in the prior art. Although, in practice, the tilting path out of the parallel arrangement of electrically insulating element 5' and carrier element 2' often moves only in the μm range, this can already have a qualitatively negative effect on the use of the semiconductor assembly 1'.

Figure 2:
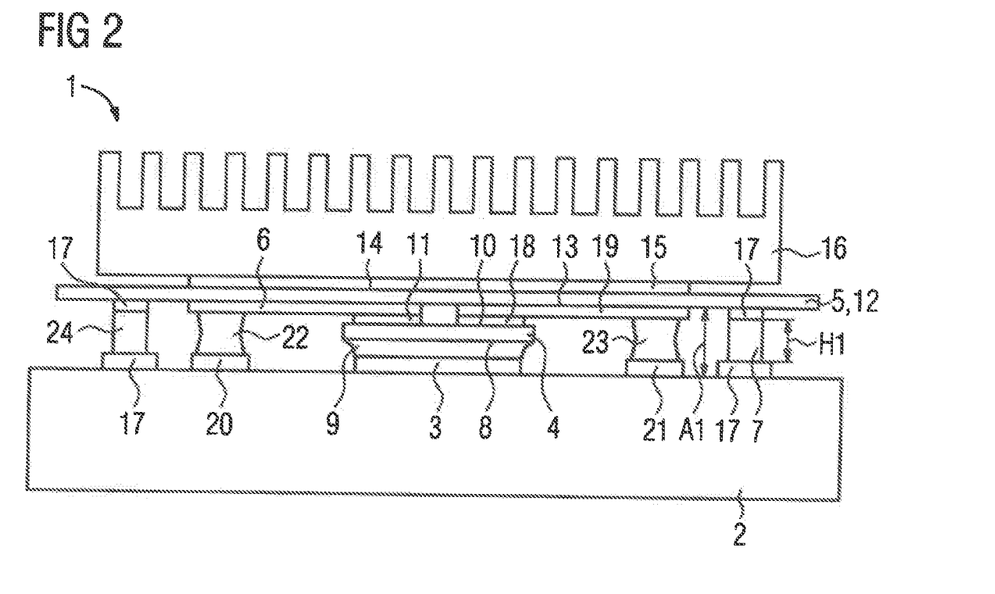
FIG. 2 shows a first schematic representation of the semiconductor assembly according to the invention with a first and a further spacer element, which are arranged in each case between a carrier element and an assembly element and are connected mechanically to the carrier element and the assembly element, wherein the assembly element is embodied as an electrically insulating element.

FIG. 2 shows a first schematic representation of an exemplary embodiment of the semiconductor assembly 1 according to the invention with a first spacer element 7 and a further spacer element 24, which are arranged in each case between a carrier element 2 and an assembly element 12 and are connected mechanically to the carrier element 2 and the assembly element 12, wherein the assembly element 12 is embodied as an electrically insulating element 5.

A semiconductor chip 4 with its first semiconductor side 8, which faces toward the carrier element 2, is connected electrically and mechanically to a first carrier element conductor path 3 of the carrier element 2 by means of a first connecting material 9.

The semiconductor chip 4 with its second semiconductor side 10 is furthermore connected mechanically and electrically on the one hand by means of a second connecting material 11 to a first insulating element conductor path 6 of the electrically insulating element 5 and on the other hand by means of a third connecting material 18 to a second insulating element conductor path 19 of the electrically insulating element 5 to the electrically insulating element 5 on its first insulating element side 13.

Furthermore, the first insulating element conductor path 6 is connected electrically and mechanically by means of a fourth connecting material 22 to a second carrier element conductor path 20 of the carrier element 2 and the second insulating element conductor path 19 is connected electrically and mechanically by means of a fifth connecting material 23 to a third carrier element conductor path 21 of the carrier element 2.

A heat conducting element 15 is arranged on the second insulating element side 14 of the electrically insulating element 5. By means of this heat conducting element 15, a heat sink 16 is connected mechanically and thermally to the electrically insulating element 5.

For maintaining a first distance A1 from the carrier element 2 to the electrically insulating element 5 (the assembly element 12) and for fixing the same, the first spacer element 7 and the further spacer element 24 are arranged between the carrier element 2 and the electrically insulating element 5 in a region of protrusions 17 on the first insulating element side 13 of the electrically insulating element 5 and of the carrier element 2 disposed opposite thereto, and are in each case connected mechanically to the electrically insulating element 5 and the carrier element 2.

A first height H1 of each of the two spacer elements 7, 24 (in FIG. 2 the first height H1 is shown only for the first spacer element 7) is smaller than the first distance A1 from the carrier element 2 to the electrically insulating element 5. The respective height values of the first height H1 of the two spacer elements 7, 24 are reduced accordingly by the respective protrusions 17 with reference to the distance value of the first distance A1.

Figure 3:
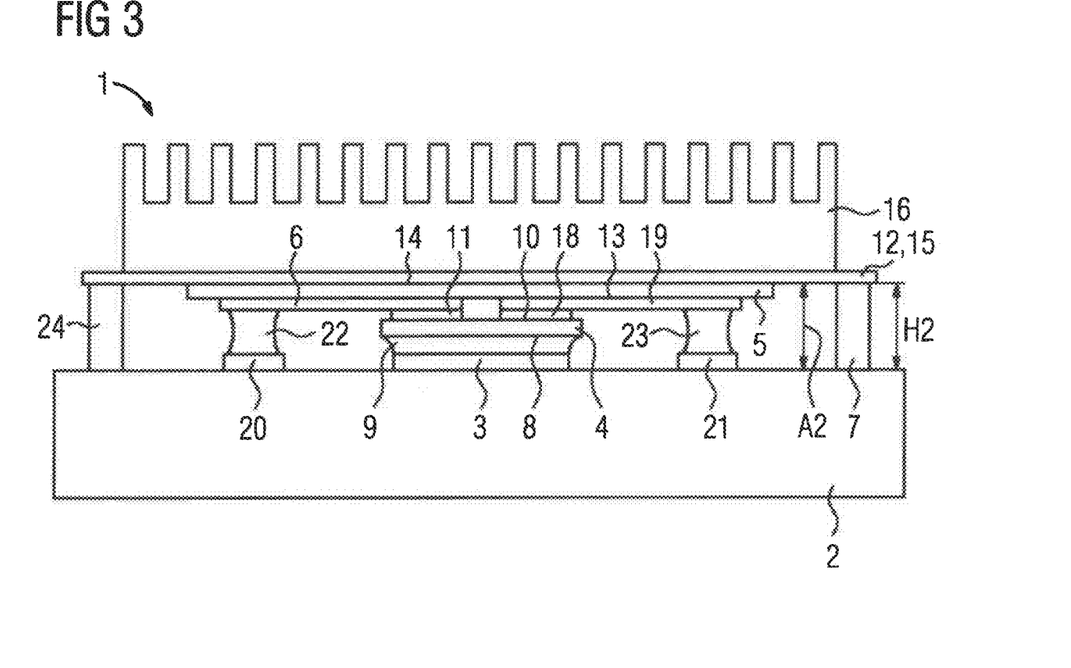
FIG. 3 shows a second schematic representation of the semiconductor assembly according to the invention as shown in FIG. 1 with a first and a further spacer element, which are arranged in each case between the carrier element and the assembly element and are connected mechanically to the carrier element and the assembly element, wherein the assembly element is embodied as a heat conducting element.

FIG. 3 shows a second schematic representation of an exemplary embodiment of the semiconductor assembly according to the invention as shown in FIG. 1 with a first spacer element 7 and a further spacer element 24, which are arranged in each case between the carrier element 2 and the assembly element 12 and are connected mechanically to the carrier element 2 and the assembly element 12, wherein the assembly element 12 is embodied as a heat conducting element 15.

A semiconductor chip 4 with its first semiconductor side 8, which faces toward the carrier element 2, is connected electrically and mechanically to a first carrier element conductor path 3 of the carrier element 2 by means of a first connecting material 9.

The semiconductor chip 4 with its second semiconductor side 10 is furthermore connected mechanically and electrically on the one hand by means of a second connecting material 11 to a first insulating element conductor path 6 of the electrically insulating element 5 and on the other hand by means of a third connecting material 18 to a second insulating element conductor path 19 of the electrically insulating element 5 to the electrically insulating element 5 on its first insulating element side 13.

Furthermore, the first insulating element conductor path 6 is connected electrically and mechanically by means of a fourth connecting material 22 to a second carrier element conductor path 20 of the carrier element 2 and the second insulating element conductor path 19 is connected electrically and mechanically by means of a fifth connecting material 23 to a third carrier element conductor path 21 of the carrier element 2.

A heat conducting element 15 is arranged on the second insulating element side 14 of the electrically insulating element 5. By means of this heat conducting element 15, a heat sink 16 is connected mechanically and thermally to the electrically insulating element 5.

For maintaining a second distance A2 from the carrier element 2 to the heat conducting element 15 (the assembly element 12) and for fixing the same, the first spacer element 7 and the further spacer element 24 are arranged between the carrier element 2 and the heat conducting element 15, and are in each case connected mechanically to the heat conducting element 15 and the carrier element 2.

A second height H2 of each of the two spacer elements 7, 24 (in FIG. 3 the second height H2 is shown only for the first spacer element 7) is equal to the second distance A2 from the carrier element 2 to the heat conducting element 15.

Figure 4:
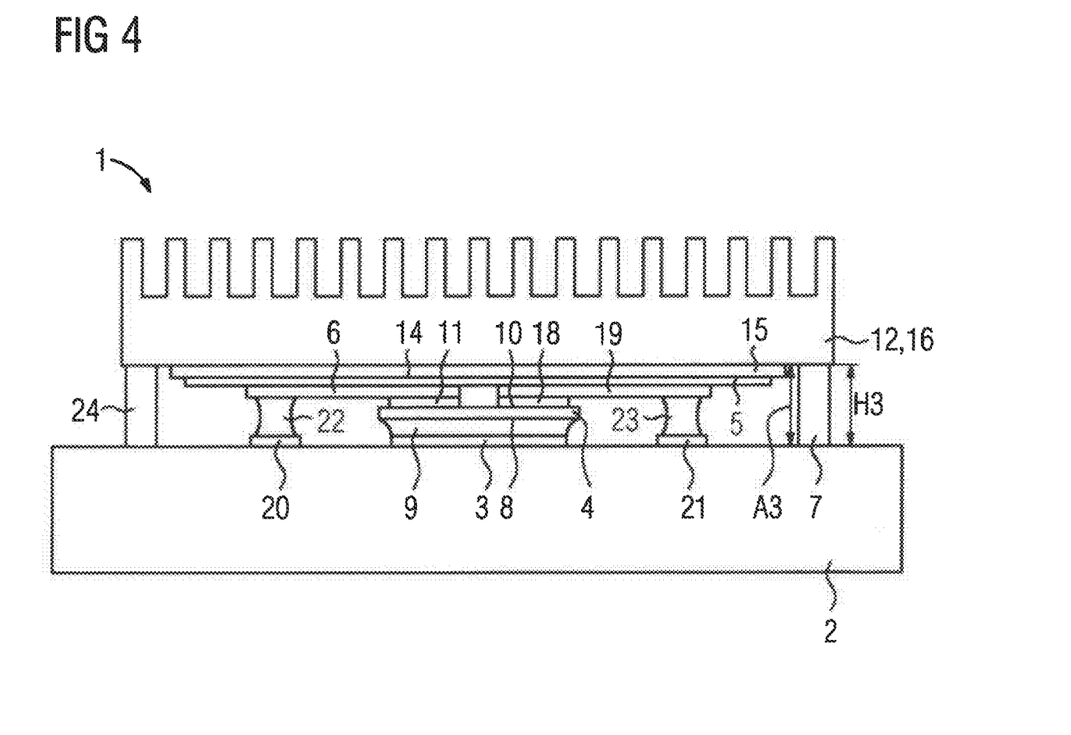
FIG. 4 shows a third schematic representation of the semiconductor assembly according to the invention as shown in FIG. 1 with a first and a further spacer element, which are arranged in each case between the carrier element and the assembly element and are connected mechanically to the carrier element and the assembly element, wherein the assembly element is embodied as a heat sink.

FIG. 4 shows a third schematic representation of an exemplary embodiment of the semiconductor assembly 1 according to the invention as shown in FIG. 1 with a first spacer element 7 and a further spacer element 24, which are arranged in each case between the carrier element 2 and the assembly element 12 and are connected mechanically to the carrier element 2 and the assembly element 12, wherein the assembly element 12 is embodied as a heat sink 16.

A semiconductor chip 4 with its first semiconductor side 8, which faces toward the carrier element 2, is connected electrically and mechanically to a first carrier element conductor path 3 of the carrier element 2 by means of a first connecting material 9.

The semiconductor chip 4 with its second semiconductor side 10 is furthermore connected mechanically and electrically on the one hand by means of a second connecting material 11 to a first insulating element conductor path 6 of the electrically insulating element 5 and on the other hand by means of a third connecting material 18 to a second insulating element conductor path 19 of the electrically insulating element 5 to the electrically insulating element 5 on its first insulating element side 13.

Furthermore, the first insulating element conductor path 6 is connected electrically and mechanically by means of a fourth connecting material 22 to a second carrier element conductor path 20 of the carder element 2 and the second insulating element conductor path 19 is connected electrically and mechanically by means of a fifth connecting material 23 to a third carrier element conductor path 21 of the carrier element 2.

A heat conducting element 15 is arranged on the second insulating element side 14 of the electrically insulating element 5. By means of this heat conducting element 15, a heat sink 16 is connected mechanically and thermally to the electrically insulating element 5.

For maintaining a third distance A3 from the carrier element 2 to the heat sink 16 (the assembly element 12) and for fixing the same, the first spacer element 7 and the further spacer element 24 are arranged between the carrier element 2 and the heat sink 16, and are in each case connected mechanically to the heat sink 16 and the carrier element 2.

A third height H3 of each of the two spacer elements 7, 24 (in FIG. 4 the third height H3 is shown only for the first spacer element 7) is equal to the third distance A3 from the carrier element 2 to the heat sink 16.

Figure 5:
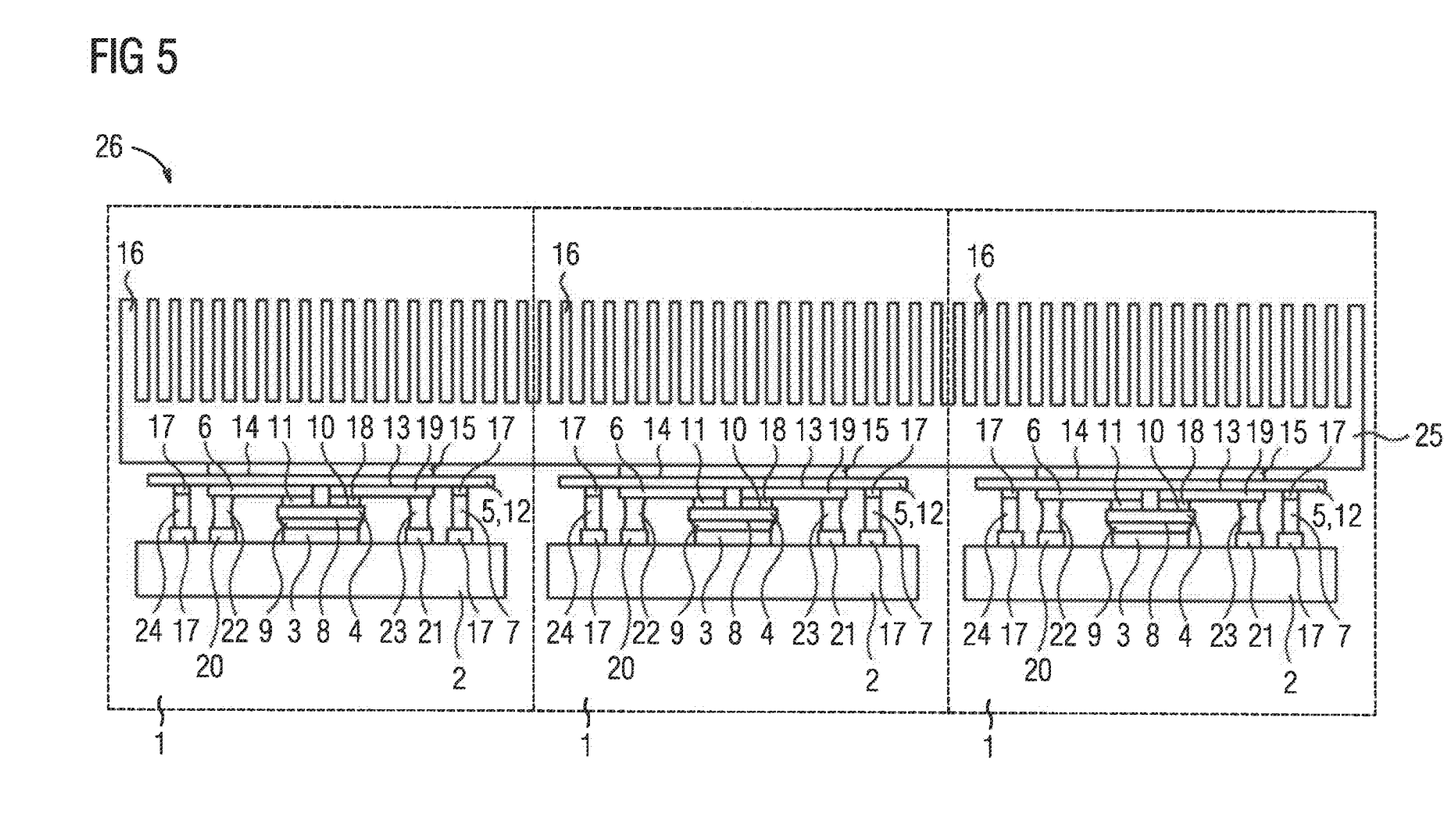
FIG. 5 shows a fourth schematic representation of three semiconductor assemblies according to the invention as shown in FIG. 1, which together form a semiconductor assembly system.

FIG. 5 shows a fourth schematic representation of three semiconductor assemblies 1 according to the invention as shown in FIG. 1, which together form a semiconductor assembly system 26.

The three semiconductor assemblies 1 shown here in FIG. 5 correspond in each case to the semiconductor assembly 1 as shown in FIG. 2.

Here, the three semiconductor assemblies 1 of the semiconductor assembly system 26 are arranged directly adjacent to one another such that by way of their respective heat sinks 16 a monolithic common heat sink 25 is embodied. The common heat sink 25 can however also be formed by the individual heat sinks 16 of the semiconductor assembly 1 in the form of partial heat sinks.

Figure 6:
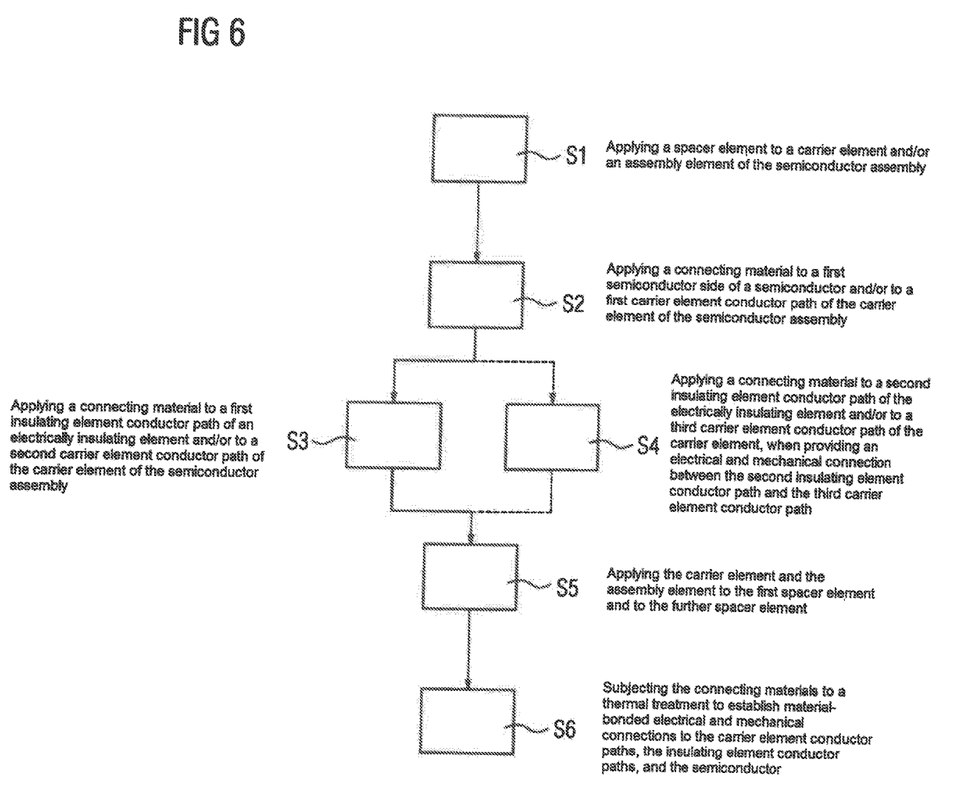
FIG. 6 shows a structogram with a method for producing the semiconductor assembly according to the invention as shown in one of FIGS. 2 to 4.

FIG. 6 shows a structogram with a method for producing the semiconductor assembly 1 according to the invention as visualized in one of FIGS. 2 to 4.

Here, the method for producing a semiconductor assembly 1 according to the invention comprises the following method steps.

In a first step S1, a first spacer element and, if present, a further spacer element is applied in a form-fit or force-fit or material-bonded manner to a carrier element and/or an assembly element of the semiconductor assembly.

It is helpful here to fix the spacer elements, which can be achieved for example using a fixing adhesive.

In a second step S2, a first connecting material is applied to a first semiconductor side of a semiconductor and/or to a first carrier element conductor path of a carrier element of the semiconductor assembly.

The connecting material can for example be a solder such as soldering tin, which is placed as a solder deposit on the first semiconductor side of the semiconductor and/or onto the first carrier element conductor path of the carrier element of the semiconductor assembly.

In a third step S3, a fourth connecting material is applied to a first insulating element conductor path of an electrically insulating element and/or to a second carrier element conductor path of the carrier element of the semiconductor assembly.

In a fourth step S4, a fifth connecting material is applied to a second insulating element conductor path of the electrically insulating element and/or to a third carrier element conductor path of the carrier element, if provision is made for a further electrical and mechanical connection between the second insulating element conductor path and the third carrier element conductor path of the semiconductor assembly.

For the third step S3 as well as for the fourth step S4, the connecting material can also for example be a solder such as soldering tin, which is placed as a solder deposit on the corresponding conductor paths of the carrier element and/or the corresponding conductor paths of the electrically insulating element.

In a fifth step S5, the carrier element and the assembly element are applied to the first spacer element and, if present, to the further spacer element.

To this end, the assembly element can be embodied as an electrically insulating element, as a heat conducting element or also as a heat sink.

In a sixth step S6, the first connecting material, the fourth connecting material and, if provided, the fifth connecting material undergo a thermal treatment in order to produce material-bonded electrical and mechanical connections to the carrier element conductor paths, the insulating element conductor paths and the semiconductor.

The thermal treatment can preferably take place by means of a soldering process, although it is also conceivable for the thermal treatment to take place by means of a sintering process.

Figure 7:
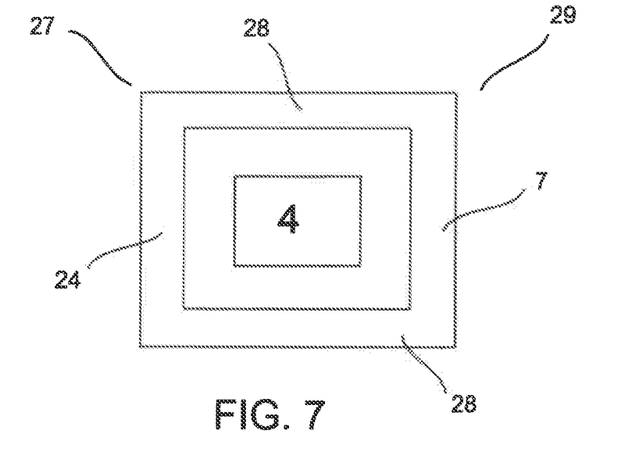
FIG. 7 shows a generalized common spacer element comprising at least two segments and forming a closed frame.

FIG. 7 shows a first spacer element 7 and at least one further spacer element 24 embodied as a common spacer element 27. The common spacer element 27 comprises at least two segments 28 and forms a closed frame 29. The frame 29 formed by the common spacer element 27 can for example advantageously surround the semiconductor 4. A geometric arrangement of the spacer elements is derived, for example, from the geometric superstructure of the semiconductor assembly.

Figure 8:
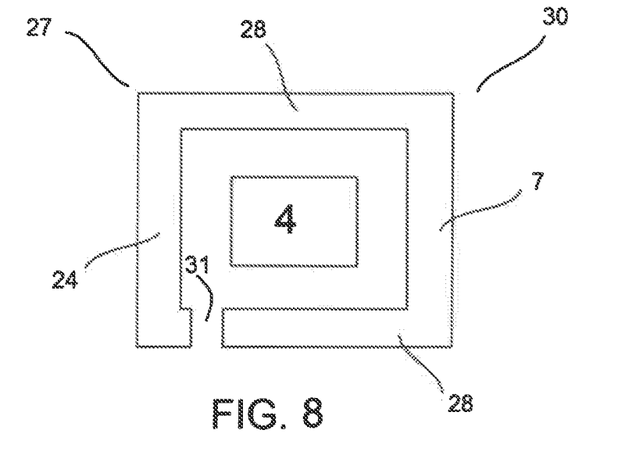
FIG. 8 shows a generalized common spacer element comprising at least two segments and forming an at least almost closed frame.

FIG. 8 shows a first spacer element 7 and at least one further spacer element 24 embodied as a common spacer element 27. The common spacer element 27 comprises at least two segments 28 and forms an at least almost closed frame 30. An almost closed frame 30 has at least one opening 31 in the frame 30. For example, an electrical connection can be guided from outside the frame 30 into the interior space surrounded by the frame 30 or a casting compound can be introduced into the interior space.

The invention claimed is:

1. A semiconductor assembly system, comprising:
   at least two semiconductor assemblies, each of which comprising an electrically insulating element including a first insulating element conductor path, a carrier element including a first carrier element conductor path which is arranged on a first insulating element side of the electrically insulating element, a semiconductor chip having a first semiconductor side and a second semiconductor side, which faces away from the first semiconductor side, a first connecting material configured to connect the semiconductor chip electrically and mechanically on the first semiconductor side to the first carrier element conductor path, a second connecting material configured to connect the semiconductor chip electrically and mechanically on the second semiconductor side to the first carrier element conductor path, a first spacer element arranged for maintaining a distance between the carrier element and an assembly element which faces toward the second semiconductor side of the semiconductor chip, said first spacer element connected mechanically to both the carrier element and the assembly element, and at least one further spacer element also arranged for maintaining the distance between the carrier element and the assembly element and connected mechanically to both the carrier element and the assembly element,
   wherein the first spacer element and the further spacer element are embodied as a common spacer element, with the common spacer element comprising at least two segments and forming a closed or at least almost closed frame,
   wherein the assembly element is a heat sink arranged on the second insulating element side and connected mechanically to the electrically insulating element, either directly or via the heat conducting element, and wherein the heat sink of one of the at least two semiconductor assemblies and the heat sink of the other one of the at least two semiconductor assemblies embody a common heat sink.

2. The semiconductor assembly system of claim 1, wherein the first spacer element and the further spacer element are at least electrically currentless or electrically volt-free and electrically currentless when the semiconductor assembly is operational.

3. The semiconductor assembly system of claim 1, wherein the first spacer element and the further spacer element are each embodied in one piece or in several pieces, in particular in a layered manner.

4. The semiconductor assembly system of claim 1, wherein, the first spacer element and the further spacer element each have a height at a height value which can assume a maximum distance value of a distance between the heat sink and the carrier element in a direct region of the mechanical connection of the first spacer element and the further spacer element to the heat sink and the carrier element.

5. The semiconductor assembly system of claim 1, wherein at least one of the carrier element and the assembly element has a side formed with a protrusion or the carrier element and the assembly element have opposing sides, each side formed with a protrusion to reduce a distance at a point between the carrier element and the assembly element at which the first spacer element and the further spacer element are arranged.

6. The semiconductor assembly system of claim 1, further comprising a further connecting material configured to connect the first insulating element conductor path electrically and mechanically to a second carrier element conductor path.

7. The semiconductor assembly system of claim 1, further comprising a third connecting material configured to connect the semiconductor electrically and mechanically on the second semiconductor side to a second insulating element conductor path arranged on the first insulating element side of the electrically insulating element and connected electrically and mechanically by a further connecting material to a third carrier element conductor path.

8. The semiconductor assembly system of claim 1, wherein the first spacer element and the further spacer element each have a melting point which is higher than a melting point of the first and second connecting materials.

* * * * *